United States Patent
Chen et al.

(10) Patent No.: US 8,450,181 B2
(45) Date of Patent: May 28, 2013

(54) IN-SITU PASSIVATION METHODS TO IMPROVE PERFORMANCE OF POLYSILICON DIODE

(75) Inventors: Xiying Chen, San Jose, CA (US); Kun Hou, Milpitas, CA (US); Chuanbin Pan, San Jose, CA (US); Abhijit Bandyopadhyay, San Jose, CA (US); Yung-Tin Chen, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 716 days.

(21) Appl. No.: 12/654,927

(22) Filed: Jan. 8, 2010

(65) Prior Publication Data

US 2011/0169126 A1 Jul. 14, 2011

(51) Int. Cl.
*H01L 29/68* (2006.01)
*H01L 21/02* (2006.01)
*H01L 21/329* (2006.01)

(52) U.S. Cl.
USPC .......................................... 438/381; 438/478

(58) Field of Classification Search
USPC .................... 438/381, 478; 257/528, E29.17, 257/E21.003, E21.352
See application file for complete search history.

(56) References Cited

U.S. PATENT DOCUMENTS

| | | | |
|---|---|---|---|
| 6,034,882 A | 3/2000 | Johnson et al. | |
| 8,183,665 B2 * | 5/2012 | Bertin et al. | 257/529 |
| 2009/0168491 A1 | 7/2009 | Schricker et al. | |
| 2009/0268508 A1 | 10/2009 | Chen et al. | |

FOREIGN PATENT DOCUMENTS

WO  WO 03/034498 A1  4/2003

OTHER PUBLICATIONS

Mercha et al., "Grain Boundary Trap Passivation in Polysilicon Thin Film Transistor Investigated by Low Frequency Noise," Thin Solid Films 383 (2001), pp. 303-306.
Chen et al., "Passivation Effect of Poly-Si Thin-Film Transistors with Fluorine-Ion-Implanted Spacers," IEEE Electron Device Letters, vol. 29, No. 6, Jun. 2008, pp. 603-605.
Kim et al., "Poly-Si TFT Fabricated by Laser-Induced In-Situ Fluorine Passivation and Laser Doping," IEEE Electron Device Letters, vol. 22, No. 8, Aug. 2001, pp. 396-398.
Aleksandrova et al., "Characteristics of Polysilicon TFTs, Hydrogenated by Ion Implantation P-Channel," Journal of Optoelectronics & Advanced Materials, vol. 7, No. 1, Feb. 2005, pp. 313-316.
Strass A et al; "Low temperature electrical surface passivation of MBE-grown pin diodes by hydrogen and oxygen plasma processes", Thin Solid Films, vol. 321, No. 1-2, May 26, 1998, pp. 261-264.
Lee J., et al; Hydrogen passivation of visible p-i-n type thin-film light-emitting diodes:, Applied Physics Letters, vol. 68, No. 8, Feb. 19, 1996, pp. 1031-1033.
Invitation to Pay Additional Search Fees issued in International Application No. PCT/US11/20293 on Jan. 24, 2013.

* cited by examiner

*Primary Examiner* — Calvin Lee
*Assistant Examiner* — Monica D Harrison
(74) *Attorney, Agent, or Firm* — The Marbury Law Group PLLC

(57) ABSTRACT

A nonvolatile memory cell including a storage element in series with a diode steering element. At least one interface of the diode steering element is passivated.

17 Claims, 10 Drawing Sheets

IN-SITU PASSIVATION METHODS TO IMPROVE PERFORMANCE OF POLYSILICON DIODE

BACKGROUND

The present invention relates generally to the field of memory devices and more specifically to the field of nonvolatile memory devices containing diode steering elements.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'. In a one diode, one resistivity switching material memory cell, the state of the memory cell is programmed by biasing the diode. In particular, polysilicon diodes can be used.

Referring to FIG. 1, a side view of a prior art diode 105 of a memory cell is shown. The diode 105 can be a p-i-n diode including a p-type semiconductor region 110, an i-type semiconductor region 130, and a n-type semiconductor region 150. The diode 105 is connected in series with a storage element 170, such as a resistivity switching material. The storage element 170 can be above or below the diode 105. In a three-dimensional architecture, the diode 105 is typically vertically oriented. The diode 105 and the storage element 170 are electrically connected between a bit line 190 and a word line 195. The diode 105 suffers a high reverse leakage and a low forward current, especially where the diode 105 is a polysilicon diode.

Referring to FIG. 2, a side view of a prior art diode with oxide barriers 205 of a memory cell is shown. The diode with oxide barriers 205 can be a p-i-n diode including a p-type semiconductor region 210, an i-type semiconductor region 230, and a n-type semiconductor region 250. A first oxide 220 is located at the interface between the p-type semiconductor region 210 and the i-type semiconductor region 230. A second oxide 240 is located at the interface between the i-type semiconductor region 230 and the n-type semiconductor region 250. The first oxide 220 and the second oxide 240 can be, for example, a rapid thermal oxide (RTO) or a native oxide. The diode with oxide barriers 205 is connected in series with a storage element 170, such as a resistivity switching material. The storage element 170 can be above or below the diode with oxide barriers 205. In a three-dimensional architecture, the diode with oxide barriers 205 is typically vertically oriented. The diode with oxide barriers 205 and the storage element 170 are electrically connected between a bit line 190 and a word line 195.

Referring to FIG. 3, a graph of a doping profile of the prior art diode with oxide barriers of FIG. 2 is shown. The graph shows the doping concentration (atoms/cm$^3$) versus the depth (nm) from the top of the diode with oxide barriers 205. Plot 310 shows the doping concentration of boron (atomic weight 11). Plot 320 shows the doping concentration of phosphorous. The first oxide 220 and the second oxide 240 prevent doping diffusion (i.e. of the boron and phosphorous) and enlarges the i-type semiconductor region 230. In this example, the i-type semiconductor region 230 is about 36 nm (i.e. approximately between 24 nm and 60 nm in FIG. 3). In a similar diode without oxide barriers a 27 nm intrinsic region ($5 \times 10^{17}$ per cm$^3$ as the intrinsic doping) would be expected.

Referring to FIG. 4, a current-voltage (I-V) graph of the prior art diode with oxide barriers of FIG. 2 and a diode without oxide barriers operating at room temperature (RT) is shown. The graph shows current (A) versus voltage (V) for devices created on four separate wafers. Plot 410 shows the I-V graph for a diode without oxide barriers created on wafer 1 (W1). Plot 420 shows the I-V graph for a diode without oxide barriers created on wafer 2 (W2). Plot 430 shows the I-V graph for a diode with oxide barriers created on wafer 3 (W3). Plot 440 shows the I-V graph for a diode with oxide barriers created on wafer 4 (W4). The diodes on all four wafers are comparable. At room temperature and at 2.0V, the forward current of the diode without oxide barriers is approximately two times the forward current of the diode with oxide barriers. At room temperature and at 4.5V, the reverse leakage current of the diode without oxide barriers is 3.5 times the reverse leakage current of the diode with oxide barriers. Therefore, the reverse leakage is reduced. However, the first oxide 220 and the second oxide 240 reduce the forward current.

Referring to FIG. 5, a current-voltage (I-V) graph of the prior art diode with oxide barriers of FIG. 2 and a diode without oxide barriers operating at high temperature (HT) is shown. The graph shows current (A) versus voltage (V) for devices created on four separate wafers. The Plot 510 shows the I-V graph for a diode without oxide barriers created on wafer 1 (W1). Plot 520 shows the I-V graph for a diode without oxide barriers created on wafer 2 (W2). Plot 530 shows the I-V graph for a diode with oxide barriers created on wafer 3 (W3). Plot 540 shows the I-V graph for a diode with oxide barriers created on wafer 4 (W4). The diodes on all four wafers are comparable. At high temperature and at 2.0V, the forward current of the diode without oxide barriers is approximately two times the forward current of the diode with oxide barriers. At high temperature and at 4.5V, the reverse leakage current of the diode without oxide barriers is 1.3 times the reverse leakage current of the diode with oxide barriers. Therefore, the reverse leakage is reduced. However, the first oxide 220 and the second oxide 240 reduce the forward current.

In addition to the reduction in the forward current, RTO grown oxide needs a relatively high popping voltage to break down the thin oxide layer. Since the popping voltage needs to be so high, it causes the diode with oxide barriers to be less unreliable. An intentionally designed native oxide can be an oxide barrier without having a popping event. However, the benefit of reverse leakage reduction is reduced at high temperature due to the impurity introduced by the native oxide layer through high temperature anneal.

SUMMARY

One embodiment relates to a storage element in series with a diode steering element. At least one interface of the diode steering element is passivated.

Another embodiment relates to a method of making a nonvolatile memory cell. The method includes forming a diode steering element. At least one interface of the diode steering element is passivated. A storage element is formed before or after forming the diode steering element.

Another embodiment relates to a method of making a nonvolatile memory cell. The method includes forming a diode steering element. At least a portion of the diode steering element is passivated. A storage element is formed before or after forming the diode steering element.

DETAILED DESCRIPTION OF THE EMBODIMENTS

As described above, the conventional polycrystalline diode and diode with oxide barriers suffer a high reverse leakage and a low forward current. Therefore, the present inventors realized that there is a need for diodes, in particular polysilicon diodes, that have a low reverse leakage and a high forward current. Furthermore, there is a need for vertically-oriented diodes, in particular polysilicon diodes, that are short (e.g., having a reduced height) while providing good performance.

Without wishing to be bound by a particular theory, the inventors believe that the high reverse leakage and a low forward current in prior art diodes are at least partially are due to traps that exist at the interface between the p-type semiconductor region 110 and the i-type semiconductor region 130 and the interface between the i-type semiconductor region 130 and the n-type semiconductor region 150. Where the diode 105 is a polysilicon diode, it is believed that the high reverse leakage and a low forward current may also be at least partially due to traps along the grain boundaries within the polysilicon.

A structure for and method of in-situ passivation of a diode are described. In the following description, for purposes of explanation, numerous specific details are set forth to provide a thorough understanding of exemplary embodiments of the invention. It will be evident, however, to one skilled in the art that the invention may be practiced without these specific details. The drawings are not to scale. In other instances, well-known structures and devices are shown in simplified form to facilitate description of the exemplary embodiments.

Figures 1, 2:
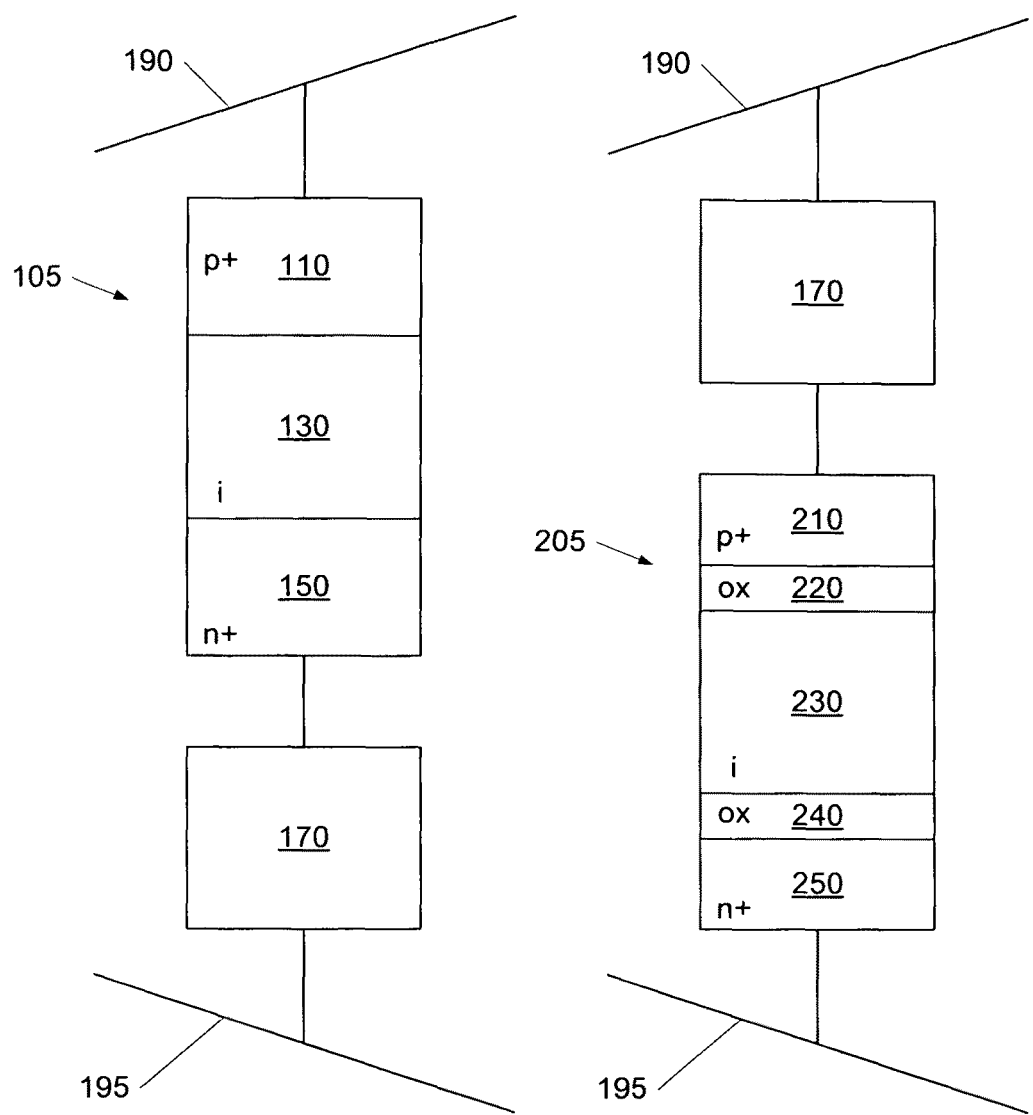
FIG. 1 is a side view of a prior art diode of a memory cell.
FIG. 2 is a side view of a prior art diode with oxide barriers of a memory cell.
Figure 3:
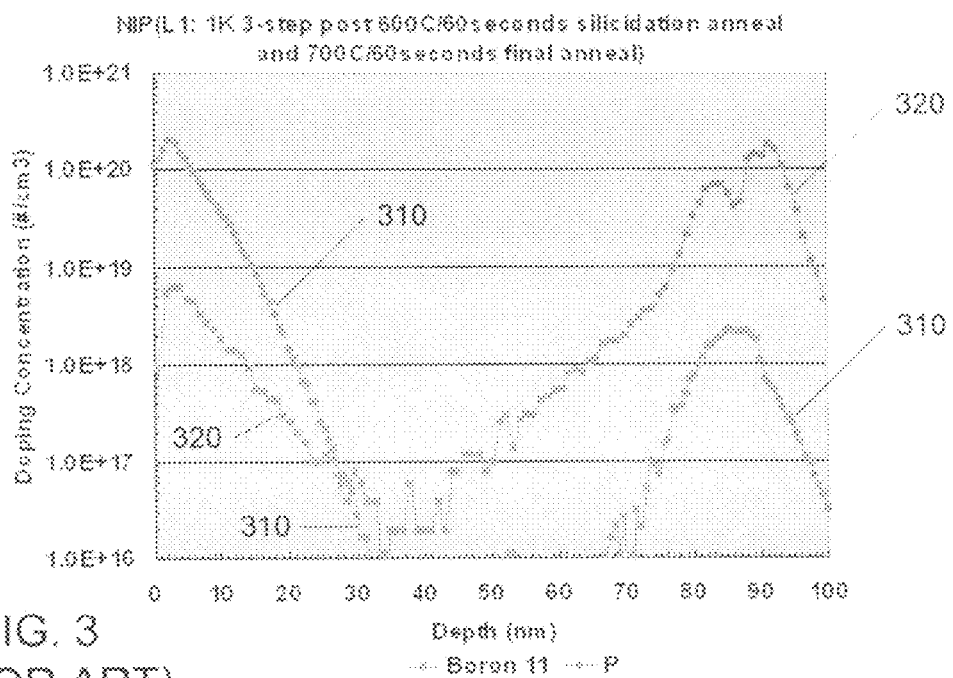
FIG. 3 is a graph of a doping profile of the prior art diode with oxide barriers of FIG. 2.
Figure 4:
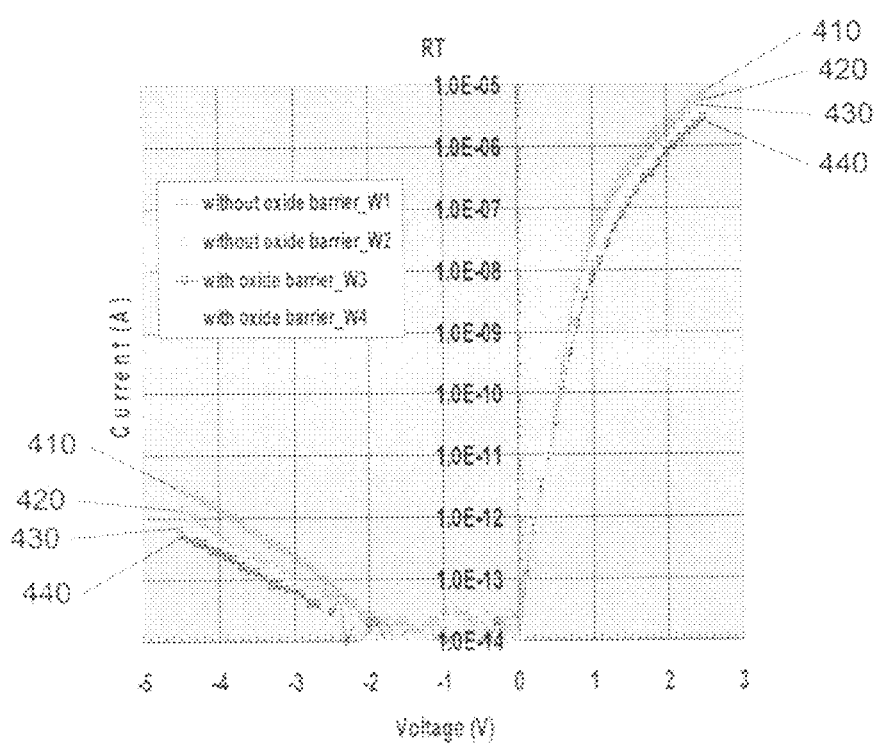
FIG. 4 is a current-voltage graph of the prior art diode with oxide barriers of FIG. 2 and a diode without oxide barriers operating at room temperature.
Figure 5:
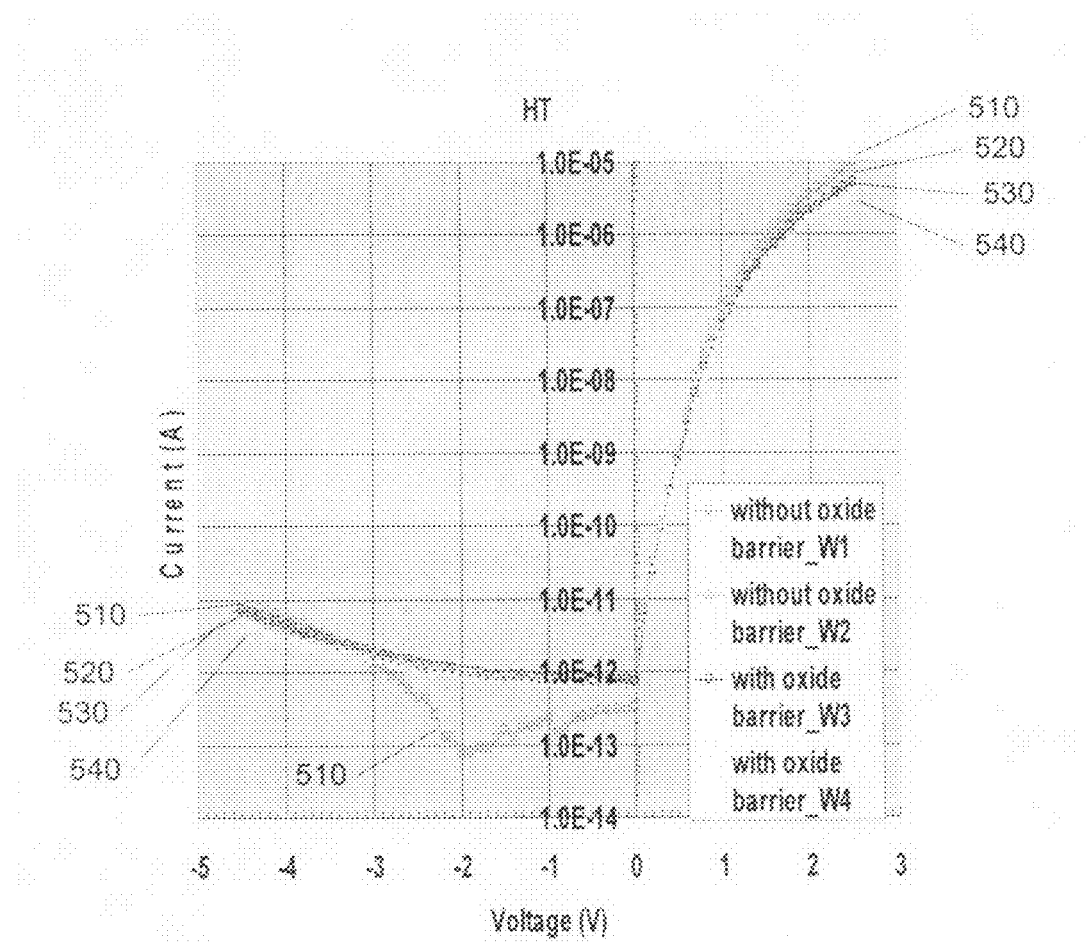
FIG. 5 is a current-voltage graph of the prior art diode with oxide barriers of FIG. 2 and a diode without oxide barriers operating at high temperature.
Figure 6:
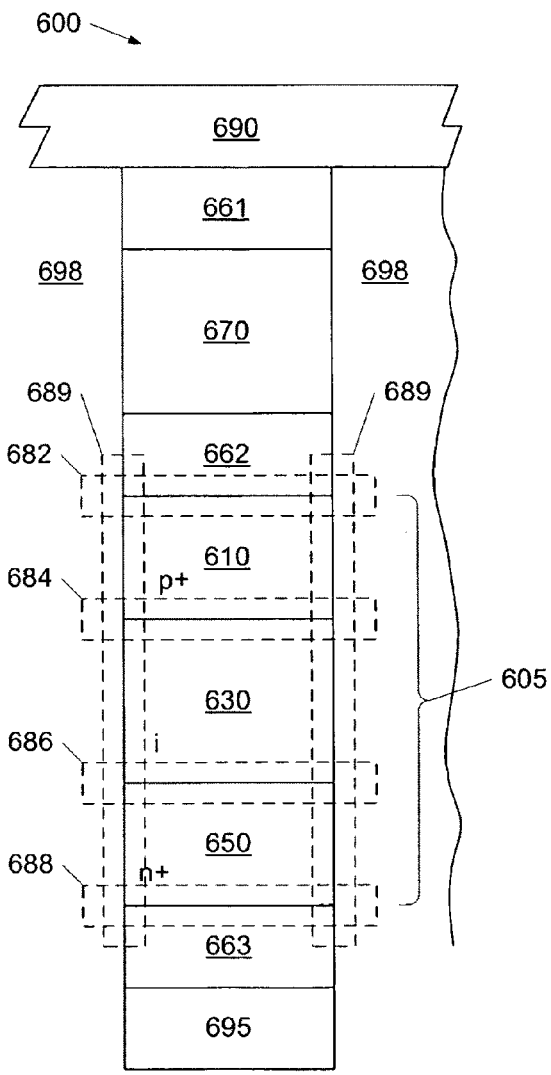
FIG. 6 is a side view of a passivated memory cell in accordance with a representative embodiment.

Referring to FIG. 6, a side view of a passivated memory cell 600 in accordance with a representative embodiment is shown. The passivated memory cell 600 includes a diode steering element 605 and a storage element 670. The storage element 670 and the diode steering element 605 can be pillar shaped. The diode steering element 605 can be located over or under the storage element 670. The passivated memory cell 600 can be located in a monolithic three dimensional array of nonvolatile memory cells.

The diode steering element 605 can be a p-n semiconductor diode, a p-i-n semiconductor diode, a punch-through diode, or a Schottky diode. The diode steering element 605 can be made of polysilicon, single crystal silicon, amorphous silicon or a combination thereof. Other semiconductor materials, such as Ge, SiGe, III-V materials, etc. may also be used. In FIG. 6, the diode steering element 605 is a p-i-n diode including a p-type semiconductor region 610, an i-type semiconductor region 630, and a n-type semiconductor region 650. The storage element 670 can be a resistivity switching material such as an antifuse dielectric, a fuse, a polysilicon memory effect material, a metal oxide or switchable complex metal oxide material, a carbon nanotube material, a carbon resistivity switching material (e.g., amorphous and/or polycrystalline carbon), a graphene switchable resistance material, a phase change material, a conductive bridge element, an electrolyte switching material, or a switchable polymer material. The diode steering element 605 and the storage element 670 are electrically connected in series by a contact 662. The diode steering element 605 is also electrically connected to a word line 695 by a contact 663. The storage element 670 is also electrically connected to a bit line 690 by a contact 661. The contacts can be any one or more metals or conductors, for example, titanium nitride, tungsten, titanium, titanium silicide, etc. The diode steering element 605 and the storage element 670 can be a nonvolatile memory cell located over a lower electrode, such as word line 695 and under an upper electrode, such as bit line 690.

The diode steering element 605 includes a number of interfaces (682-688) where different materials or regions of the diode steering element 605 meet. A first interface 682 occurs where the p-type semiconductor region 610 contacts the contact 662. A second interface 684 occurs where the p-type semiconductor region 610 contacts the i-type semiconductor region 630. A third interface 686 occurs where the i-type semiconductor region 630 contacts the n-type semiconductor region 650. A fourth interface 688 occurs where the n-type semiconductor region 650 contacts the contact 663. A side interface 689 occurs where the diode steering element 605 contacts a dielectric 698, that surrounds the diode steering element 605. The dielectric 698 can be, for example, silicon dioxide, silicon nitride, etc.

In one representative embodiment, at least one of the interfaces (682-689) can be passivated using a passivation dopant such as hydrogen, fluorine, or any other dopant that eliminates a trap. Any combination of one or more than one interfaces may be passivated. Alternatively, all of the interfaces (682-689) can be passivated. For example, the upper interfaces 682 and 684 may be passivated while the lower interface 686 may not be passivated. An interface can be passivated when a passivating element or dopant is present at the interface. Preferably, the doping profile of the passivation dopant peaks at about the interface (e.g., within 10 nm from the interface). Alternatively, an interface can be passivated when the number of traps at the interface is reduced to less than $1 \times 10^{12}$ traps per cm². The number of traps at the interface is preferably less than $5 \times 10^{11}$ traps per cm², such as $1 \times 10^{10}$ to $5 \times 10^{11}$ traps per cm². By reducing the number of traps to about $5 \times 10^{11}$ traps per cm² or less, the effective barrier height of the diode steering element 605 is reduced by about 0.4 to 0.7 volts. In addition, different passivation dopants can be used for different interfaces. Likewise, different concentrations of a passivation dopant can be used different interfaces. For example, the first interface 682 could have $1 \times 10^{12}$ traps per cm² and the middle 684, 686 and/or side interfaces 689 could have $5 \times 10^{11}$ traps per cm².

In another representative embodiment, at least a potion of the diode steering element 605 can be passivated. The at least a potion of the diode steering element 605 can be the p-type semiconductor region 610, the i-type semiconductor region 630, the n-type semiconductor region 650, or a combination thereof. For example, the upper regions 610 and 630 of a vertical diode may be passivated while the lower region 650 is not. Alternatively, the entire diode steering element 605 can be passivated. The doping profile of the passivation dopant can be approximately uniform or non-uniform (i.e., more dopant in some regions than in others; for example more dopant in the upper 610, 630 regions than in the lower region 650).

Figure 7:
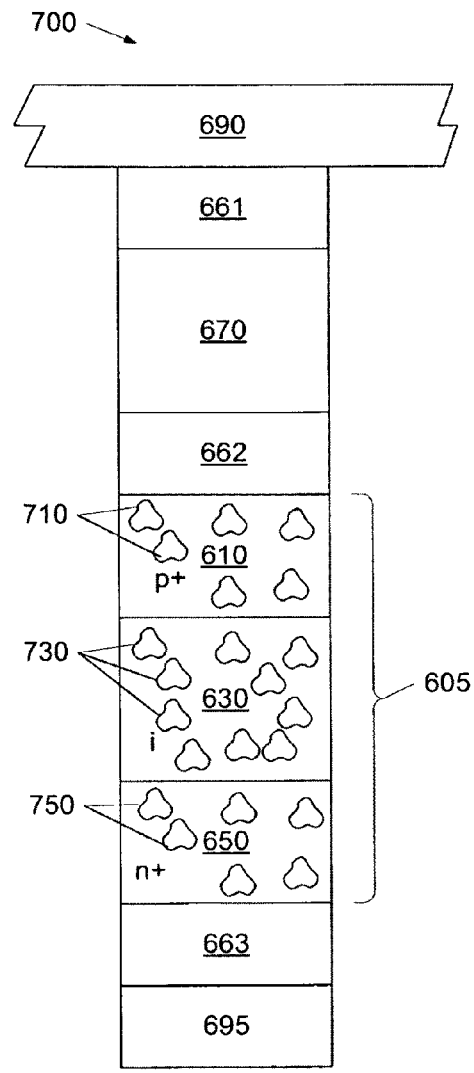
FIG. 7 is a side view of the passivated memory cell of FIG. 6 with a polysilicon diode in accordance with a representative embodiment.

Referring to FIG. 7, a side view of the passivated memory cell of FIG. 6 with a polysilicon diode in accordance with a representative embodiment is shown. The diode steering element 605 can be a polysilicon p-i-n diode. The p-type semiconductor region 610 can be p-type polysilicon including polysilicon grains 710. The i-type semiconductor region 630 can be i-type polysilicon including polysilicon grains 730. The n-type semiconductor region 650 can be n-type polysilicon including polysilicon grains 750.

The polysilicon grains 710-750 are separated by grain boundaries. In addition, the grain boundaries can separate amorphous material, such as amorphous silicon, from the polysilicon 710-750. The grain boundaries of the polysilicon grains 710-750 can also be passivated using a passivation dopant such as hydrogen, fluorine, and/or any other dopant that eliminates or passivates a trap, such as dangling bonds.

A diode steering element can be passivated in-situ using various methods. A diode steering element can be passivated in-situ, for example, using an atmosphere, ion implantation, or by a doped insulator outdiffusion methods.

Figure 8:
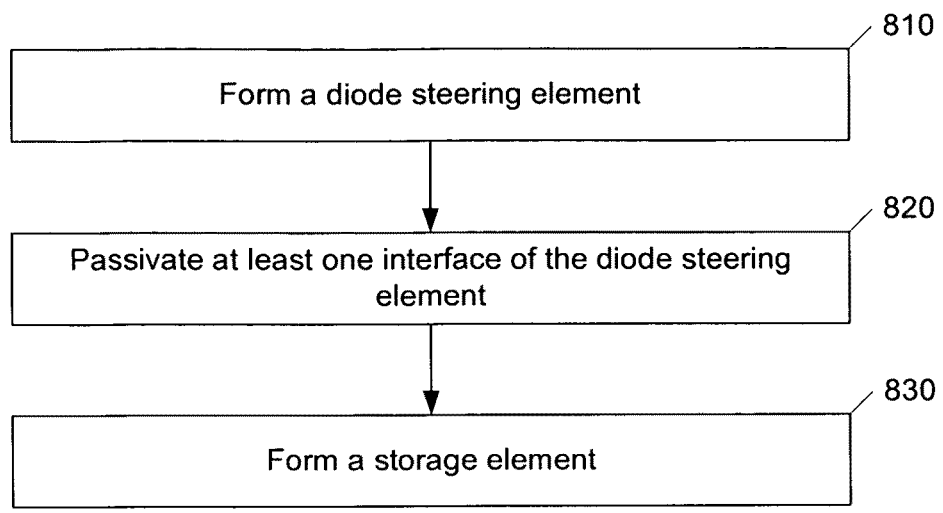
FIG. 8 is a flowchart of a method for passivating at least one interface of a diode in accordance with a representative embodiment.
Figure 9:
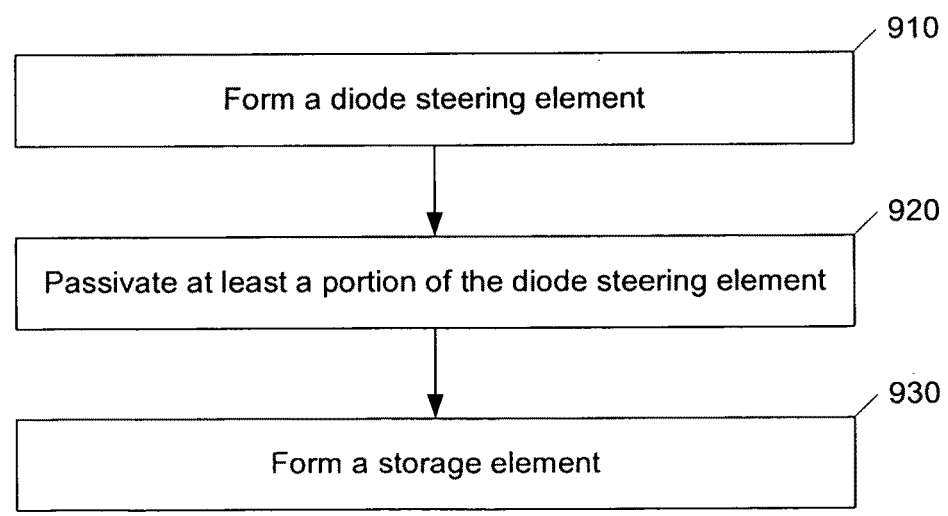
FIG. 9 is a flowchart of a method for passivating at least a portion of a diode in accordance with a representative embodiment.

Referring to FIGS. 8 and 9 flowcharts of methods for passivating at least one interface of a diode in accordance with a representative embodiment are shown. Additional, fewer, or different operations may be performed depending on the particular embodiment. The operations may also be performed in a different order than that shown and described. In an operation 810, 910 a diode steering element is formed. The diode steering element can be a p-n semiconductor diode, a p-i-n semiconductor diode, a punch-through diode, or a Schottky diode. The diode steering element can be made of polysilicon, single crystal silicon, amorphous silicon or a combination thereof. Preferably, the diode is initially formed in an amorphous state. The diode steering element can be part of an array of memory cells that are read and programmed using word lines and bit lines. Each of the memory cells can be electrically connected between a word line and a bit line. In one embodiment, the diode steering element is formed over a word line. The diode steering element can be pillar shaped. The pillar shape can be formed, for example, by etching the diode layers before or after the passivation an/or anneal. Alternatively, the diode may be formed by a damascene method in openings in an insulating layer, as described in US Published Application 2009/0179310 A1, incorporated herein by reference in its entirety. The upper region 610 may be formed by depositing a doped layer or region on the intrinsic layer or region 630 or by implanting ions (e.g., boron) into the intrinsic layer or regions 630.

In an operation 820, 920 at least one interface and/or region of the diode steering element is passivated. The at least one interface of the diode steering element can be an interface between two regions of the diode steering element or a side interface of the diode steering element, as described above. The diode steering element is passivated, for example, using an atmosphere, ion implantation, or by a doped insulator outdiffusion method. The passivation dopant can be hydrogen, fluorine, or any other dopant that or reduces eliminates a trap.

The diode steering element can be annealed to recrystallize amorphous silicon to polysilicon after the passivation. In addition, a metal layer (e.g., Ti) can be formed over the passivated diode steering element. The diode steering element can then be annealed to form a silicide (e.g., titanium silicide) on an upper portion of the diode steering element while recrystallizing the amorphous silicon to polysilicon.

In an operation 830, a storage element is formed on top of the diode steering element. The storage element can be a resistivity switching material such as an antifuse dielectric, fuse, a polysilicon memory effect material, a metal oxide or switchable complex metal oxide material, a carbon nanotube material, a carbon resistivity switching material, a graphene switchable resistance material, a phase change material, a conductive bridge element, an electrolyte switching material, or a switchable polymer material. The storage element can be formed before or after the diode steering element (i.e., the order of steps 810, 910 and 830, 930 may be reversed).

Atmospheric Passivation

Figure 10:
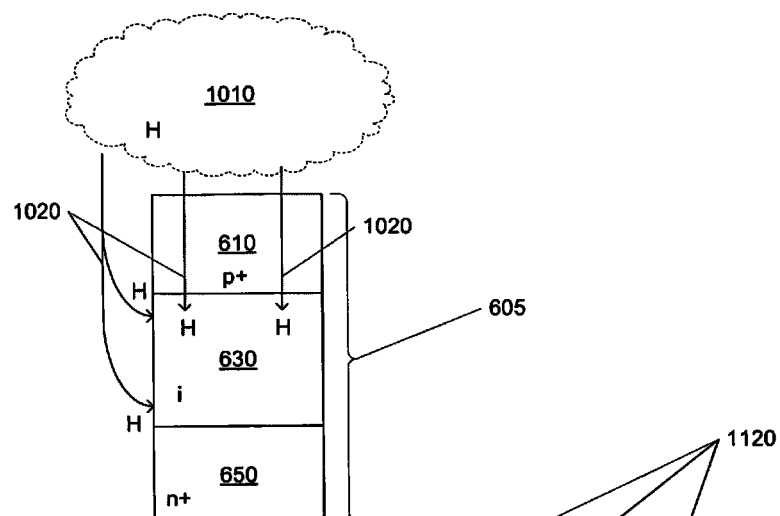
FIG. 10 is a diagram depicting atmosphere passivation in accordance with a representative embodiment.

Referring to FIG. 10, a diagram depicting an atmospheric passivation method in accordance with a representative embodiment is shown. FIG. 10 depicts a diode steering element 605. The sides of the diode steering element 605 may be exposed as shown in FIG. 10 or covered by an insulating fill layer. The passivation of particular portions and interfaces of the diode steering element 605 can be controlled in part by what parts of the diode steering element 605 are protected by dielectric or other materials. The diode steering element 605 can be a p-i-n diode including a p-type semiconductor region 610, an i-type semiconductor region 630, and a n-type semiconductor region 650. During passivation, the top and sides of the diode steering element 605 are exposed to an atmosphere 1010 at an elevated temperature. The atmosphere 1010 contains dopants (i.e., the passivating element which will dope the diode). For example, the atmosphere 1010 can be a forming gas of 50% hydrogen gas and 50% nitrogen gas at about 450-550 degrees Celsius. The hydrogen gas can also be provided by ammonia ($NH_3$). The atmosphere 1010 can be at a temperature less than 600 degrees Celsius. Alternatively, the atmosphere 1010 can be a hydrogen plasma. Alternatively, the atmosphere 1010 could contain fluorine at a lower concentration than hydrogen to prevent etching of the insulating (i.e., dielectric) layer.

Before passivation, the diode steering element 605 is preferably in an amorphous state. When the diode steering element 605 is exposed to the atmosphere 1010 at an elevated temperature, the passivation dopants, such as hydrogen, in the atmosphere 1010 diffuse into the diode steering element 605 as shown by arrows 1020. Final location of the dopants can be controlled by varying process parameters such as hydrogen concentration in the atmosphere, atmosphere temperature, exposure time, anneals parameters, etc. In one embodiment, the concentration of the hydrogen dopant peaks at about one of the interfaces in the diode steering element 605, such as the interface 684. In another embodiment, the hydrogen dopant is located in at least a portion of the diode steering element 605, such as regions 610 and 630. The dopant may be absent at interface 686 or region 650 if desired. The dopants saturate the dangling bonds either in at least one of the interfaces and/or at least a portion of the diode steering element 605. Therefore, for example, after a silicidation/recrystallization anneal, the traps along interface, portions, and/or the grain boundaries are reduced and the electron mobility is improved.

Ion Implantation Passivation

Figure 11:
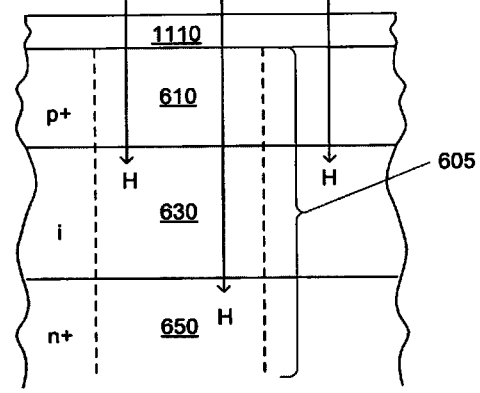
FIG. 11 is a diagram depicting ion implantation passivation in accordance with a representative embodiment.

Referring to FIG. 11, a diagram depicting ion implantation passivation in accordance with a representative embodiment is shown. FIG. 11 depicts a diode steering element 605. The diode steering element 605 is optionally not yet been etched into a pillar and is shown as a plurality of layers. The diode steering element 605 can be a p-i-n diode including a p-type semiconductor region 610, an i-type semiconductor region 630, and a n-type semiconductor region 650. During passivation, the diode steering element 605 is implanted with dopants 1120. For example, the diode steering element 605 can be implanted with hydrogen, fluorine, or any other dopant that eliminates a trap. Before implantation, an optional pad oxide 1110 is formed to protect the diode. Final location of the dopants can be controlled by varying process parameters such as beam energy, exposure time, anneal parameters. Preferably, the peak of the implanted hydrogen is within 10 nm of the interface 684.

Figure 12:
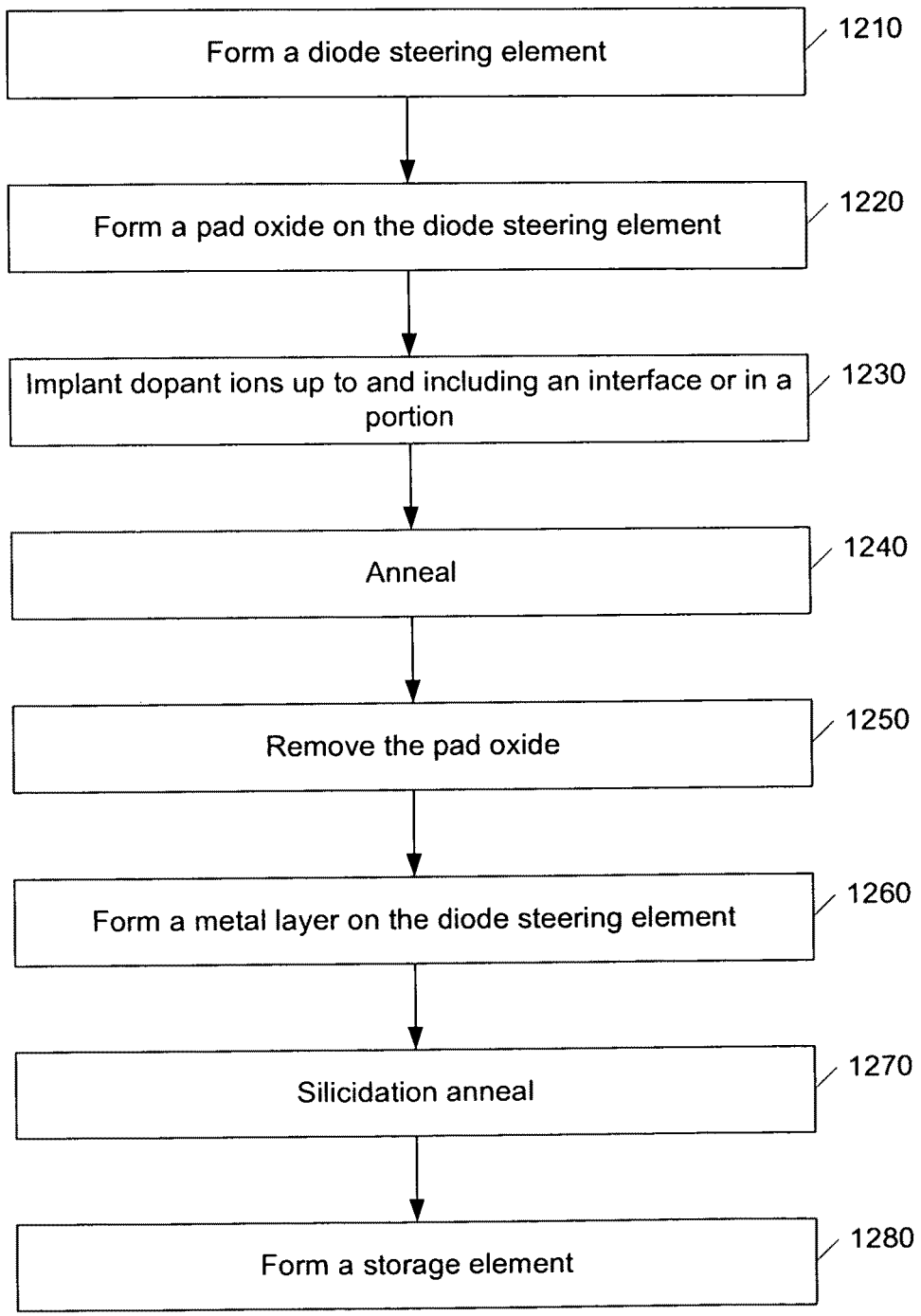
FIG. 12 is a flowchart of a method for ion implanting a diode steering element in accordance with a representative embodiment.

Referring to FIG. 12, a flowchart of a method for ion implanting a diode steering element in accordance with a representative embodiment is shown. Additional, fewer, or different operations may be performed depending on the particular embodiment. The operations may also be performed in a different order than that shown and described. In an operation 1210, a diode steering element is formed. The diode steering element can be formed in an amorphous or polysilicon state. In an operation 1220, an optional pad oxide is formed on the diode steering element to prevent or reduce the channeling effect.

In an operation 1230, the diode steering element can be implanted with hydrogen, fluorine, or any other dopant that eliminates a trap. For example, the ion implantation can be hydrogen ions at 8-12 keV, such as 10 keV. The implantation profile can be designed to passivate at least one interface and/or portion of the diode steering element, as discussed above.

Figure 13:
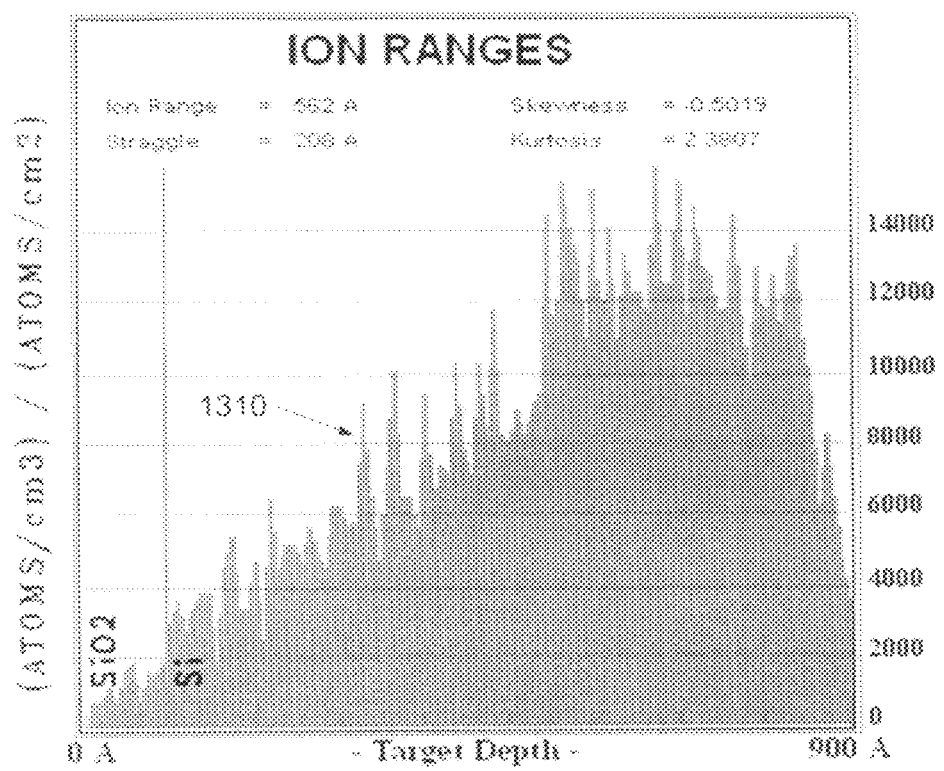
FIG. 13 is a diagram depicting an expected ion implantation profile in accordance with a representative embodiment.

Referring to FIG. 13, a diagram depicting an expected ion implantation profile in accordance with a representative embodiment is shown. The graph shows the doping concentration (atoms/$cm^3$) for hydrogen versus the depth (nm) from the top of the pad oxide. Plot 1310 indicates the expected hydrogen ion doping profile before a thermal anneal.

Referring again to FIG. 12, in an operation 1240, the diode steering element is annealed to distribute the passivation dopants (e.g., an activation anneal) and to repair any defects created by the implantation. The anneal is at less than 500 degrees Celsius for about half an hour in a hydrogen ambient. In an operation 1250, the pad oxide is removed.

Optionally, in an operation 1260, a metal layer is formed on top of the diode steering element. The metal layer can be for example, titanium. In an operation 1270, the diode steering element and metal layer are annealed causing a silicide layer to form on the polysilicon of the diode.

In an operation 1280, a storage element is formed on top of the diode steering element. The storage element can be formed before or after the diode steering element. Thus, the order of steps 1210, 1280 may be reversed.

Doped Insulator Passivation

Figure 14:
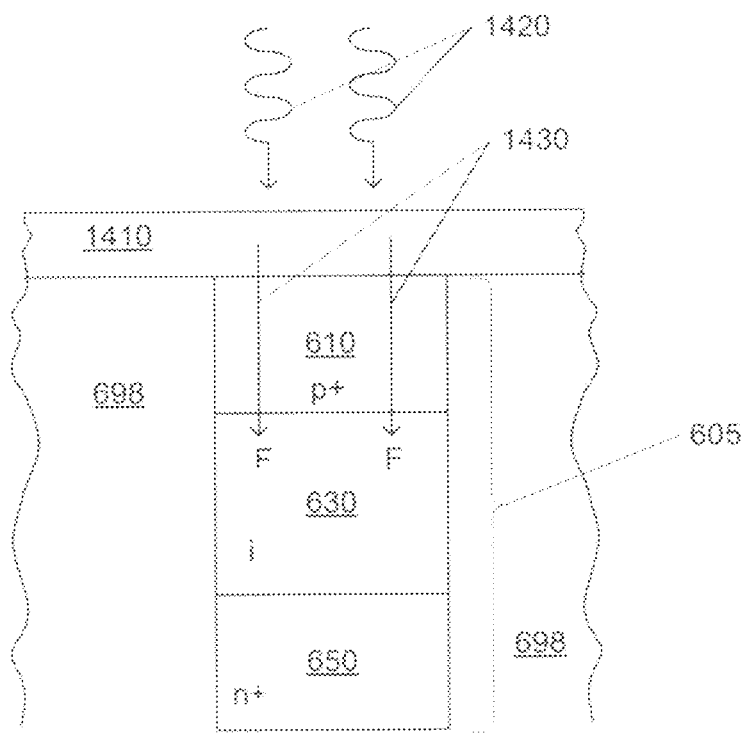
FIG. 14 is a diagram depicting doped insulator passivation in accordance with a representative embodiment.

Referring to FIG. 14, a diagram depicting doped insulator outdiffusion passivation method in accordance with a representative embodiment is shown. FIG. 14 depicts a diode steering element 605. The diode steering element 605 is shown as being surrounded with an insulating material 698, such as silicon dioxide. The diode steering element 605 can be a p-i-n diode including a p-type semiconductor region 610, an i-type semiconductor region 630, and a n-type semiconductor region 650. A doped insulator 1410 is formed on the diode steering element 605. The doped insulator 1410 can contain hydrogen, fluorine, or any other dopant that eliminates a trap. During passivation, dopants 1430 from the doped insulator 1410 diffuse into the diode steering element 605 when radiation, such as laser light 1420 temporarily melts the top of the diode steering element 605 (e.g., melts region 610 but not 630). Final location of the dopants can be controlled by varying process parameters such as insulator dopant concentration, exposure time, anneal parameters, etc. as is well known in the art.

Figure 15:
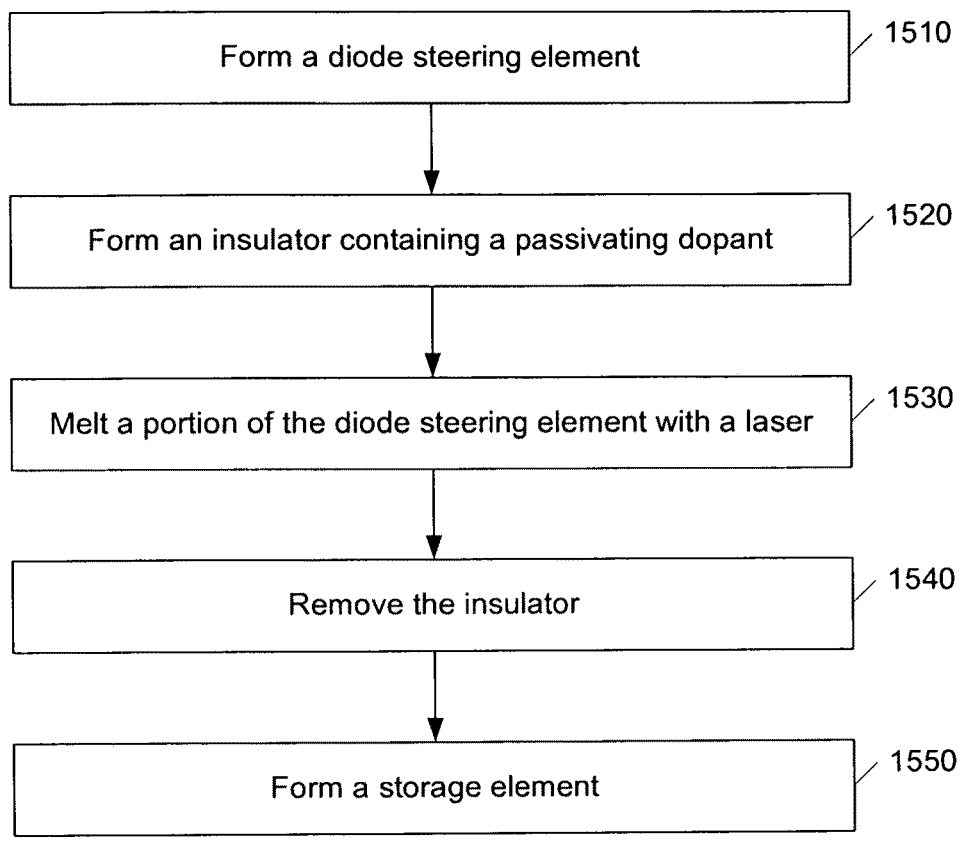
FIG. 15 is a flowchart of a method for doped insulator passivation in accordance with a representative embodiment.

Referring to FIG. 15, a flowchart of a method for doped insulator passivation outdiffusion in accordance with a representative embodiment is shown. Additional, fewer, or different operations may be performed depending on the particular embodiment. The operations may also be performed in a different order than that shown and described. In an operation 1510, a diode steering element is formed. The diode steering element can be formed in an amorphous or recrystallized state. In an operation 1520, a doped insulator is formed on the diode steering element. The doped insulator can be, for example, fluorine doped silicon oxide $SiO_xF_y$, where 0<x, y<1. The fluorine doped silicon oxide can be formed by plasma enhanced chemical vapor deposition (PECVD) using tetraethyl orthosilicate (TEOS), $O_2$, and $C_2F_6$ gas. The fluorine doped silicon oxide can be about 30-100 nm, such as 50 nm thick.

In an operation 1530, the top portion of the diode steering element is melted using laser light. Preferably, the laser is a XeCl excimer laser. The fluorine doped silicon oxide is transparent to the light/wavelength of the XeCl laser. Therefore, the laser temporarily melts the top portion of the diode steering element without melting the oxide 1410. In one example, the laser is pulsed for 10 second intervals at several hundred $mJ/cm^2$. The dopant atoms, e.g. fluorine atoms, diffuse from the fluorine doped silicon oxide film into the molten a-Si of the diode steering element. Hence, the affected region of the diode steering element is transformed to a fluorine passivated polycrystalline film region. The laser anneal may also recrystallize the diode material (e.g., convert amorphous silicon or small grain polysilicon to large grain polysilicon).

In an operation 1540, the fluorine doped silicon oxide is removed. In an operation 1550, a storage element is formed on top of the diode steering element. The storage element can be formed before or after the diode steering element.

Figure 16:
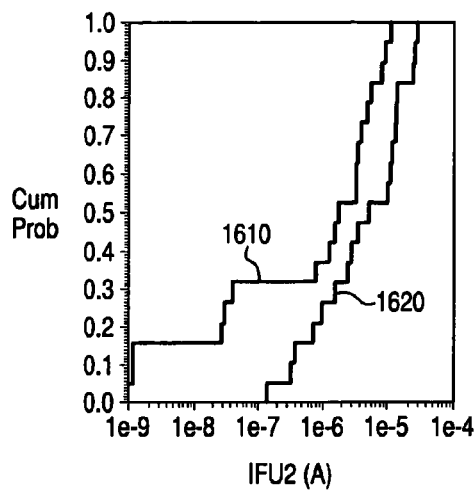
FIG. 16 is a graph of cumulative probability distribution versus forward current for diodes with and without reduced traps in accordance with a representative embodiment.

Referring to FIG. 16, a graph of cumulative probability distribution versus forward current for diodes with and without reduced traps in accordance with a representative embodiment is shown. The graph shows the cumulative probability distribution (Cum Prob) versus the forward current at 2 volts (IFU2) (A) for an unpassivated diode and a diode with hydrogen atmosphere passivation (50/50 hydrogen/nitrogen forming gas, 500 C, 2 hours). Plot 1610 shows the cumulative probability distribution graph for an unpassivated diode without passivation. Plot 1620 shows the cumulative probability distribution graph for a diode with hydrogen atmosphere passivation. The median forward current at 2V of the diode with hydrogen atmosphere passivation is two to three times to larger than the median forward current at 2V of the unpassivated diode without passivation.

Figure 17:
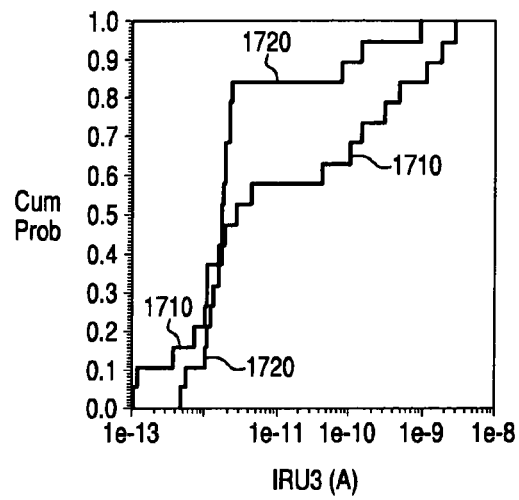
FIG. 17 is a graph of cumulative probability distribution versus reverse current for diodes with and without reduced traps in accordance with a representative embodiment.

Referring to FIG. 17, a graph of cumulative probability distribution versus reverse current for diodes with and without reduced traps in accordance with a representative embodiment is shown. The graph shows the cumulative probability distribution (Cum Prob) versus the reverse current at 3 volts (IRU3) (A) for an unpassivated diode and a diode with hydrogen atmosphere passivation. Plot 1710 shows the cumulative probability distribution graph for a regular diode without passivation. Plot 1720 shows the cumulative probability distribution graph for a diode with hydrogen atmosphere passivation. The median reverse current at 3V of the diode with hydrogen atmosphere passivation is much better than the median reverse current at 3V of the regular diode without passivation. 80% of the diodes with hydrogen atmosphere passivation had a reverse leakage less than 2.5 pA at 3V. The passivated diode also results in a tighter distribution of the currents.

Figure 18:
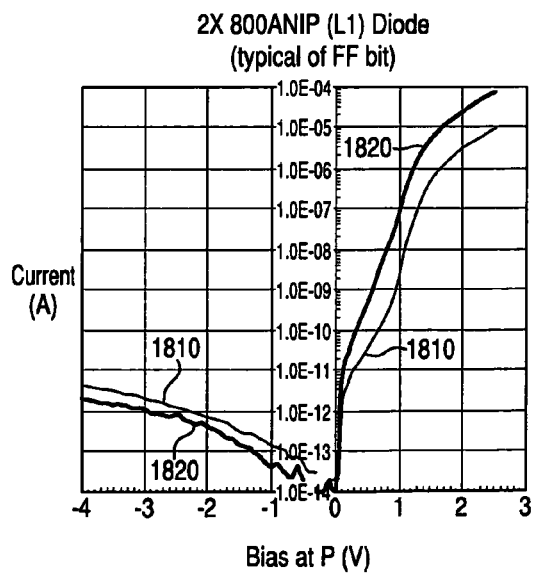
FIG. 18 is a current-voltage graph of a typical diode with and without reduced traps in accordance with a representative embodiment.

Referring to FIG. 18, a current-voltage (I-V) graph of a typical diode with and without passivation in accordance with a representative embodiment is shown. The graph shows current (A) versus voltage (V) for an unpassivated diode and a diode with hydrogen atmosphere passivation. Plot 1810 shows the I-V graph for the regular diode. Plot 1820 shows the I-V graph for the diode with hydrogen atmosphere passivation. Advantageously, the forward current at 2V of the diode with hydrogen atmosphere passivation is approximately one order higher than the forward current at 2V of the regular diode. Advantageously, the reverse leakage current of the diode with hydrogen atmosphere passivation is less than the reverse leakage current of the regular diode.

Figure 19:
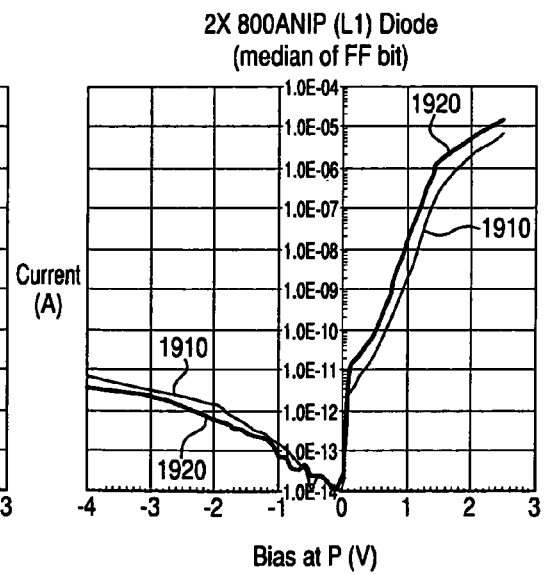
FIG. 19 is a current-voltage graph of a median diode with and without reduced traps in accordance with a representative embodiment.

Referring to FIG. 19, a current-voltage (I-V) graph of a median diode (e.g., out of the sets of diodes formed) with and without reduced traps in accordance with a representative embodiment is shown. The graph shows the median current (A) versus the median voltage (V) for many regular diodes and many diodes with hydrogen atmosphere passivation. Plot 1910 shows the median I-V graph for the regular diodes. Plot 1920 shows the median I-V graph for the diodes with hydrogen atmosphere passivation. Advantageously, the forward current of the diode with hydrogen atmosphere passivation is approximately two to three times the forward current of the regular diode. Advantageously, the reverse leakage current of the diode with hydrogen atmosphere passivation is less than the reverse leakage current of the regular diode.

During read operations or set-reset operations of a memory cell in a large array of memory cells, the reverse leakage of the diodes results in a voltage drop along the word line. If the voltage drop is large enough, an unselected bit under a selected bit line might be programmed or erased unexpectedly (in the set-reset operation), or might turn into a forward condition and result in a read current unexpectedly (in the read operation). Advantageously, the reduced reverse leakage current of a passivated diode reduces the chance of errors. Also, as the steering element of a three-dimensional memory cell, the diode needs to deliver necessary current to program or erase cell. Advantageously, the better forward current characteristics of a passivated diode ensure that enough current is available program or erase cell.

Thus, advantageously, passivated diodes enhance forward current and reduce reverse leakage. Therefore, because the passivated diodes have better forward current and reverse leakage characteristics, the height of a memory cell pillar using a passivated diode can be reduced relative to an unpassivated diode with the same characteristics.

The foregoing description of the exemplary embodiments have been presented for purposes of illustration and of description. It is not intended to be exhaustive or to limit the invention to the precise form disclosed, and modifications and variations are possible in light of the above teachings or may be acquired from practice of the invention. For example, the described exemplary embodiments focused on one layer of memory cells. The present invention, however, is not limited to one layer. Those skilled in the art will recognize that the device and methods of the present invention may be practiced using multiple levels of memory cells that are mirrored, half mirrored, or have separate X-line and Y line layers as is well known in the art of three dimensional memory arrays. In a half mirrored arrangement the Y-line is shared between two levels of memory cells. The Y-line has diode layers both above and below. Additionally, types of diodes and resistivity switching materials may be changed without deviating from the spirit of the invention. Similarly, various types and numbers of diodes may be employed such as distributed diodes. Likewise, the device and methods of the present invention may be practiced using other passive element memory systems. Consequently, a wide variety of current-voltage profiles are possible. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

While the invention has been largely described with respect to the embodiments set forth above, the invention is not necessarily limited to these embodiments. For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S.

patent application Ser. No. 10/185,508 by Cleeves, filed Jun. 27, 2002, entitled "Three Dimensional Memory", each of which is hereby incorporated by reference.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above) so that the anode terminals are connected to bit lines and the cathode terminals to word lines, or may reverse the directionality of memory cells in the adjacent plane (e.g., a serial chain diode stack memory array as described in U.S. patent application Ser. No. 09/897,705 by Kleveland, et al., referred to above). Consequently, X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as subarrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. All patents and patent applications mentioned herein are incorporated by reference in their entirety.

What is claimed is:

1. A method of making a nonvolatile memory cell, comprising:
    forming a diode steering element;
    passivating at least one interface of the diode steering element;
    forming a storage element before or after forming the diode steering element;
    forming a metal layer on the diode steering element after the step of passivating; and
    annealing the diode steering element to form a silicide on an upper portion of the diode steering element while recrystallizing the diode steering element.

2. The method of claim 1, wherein:
    the diode steering element comprises a p-n semiconductor diode, a p-i-n semiconductor diode, a punch-through diode, or a Schottky diode; and
    the storage element comprises a resistivity switching material selected from an antifuse dielectric, fuse, a polysilicon memory effect material, a metal oxide or switchable complex metal oxide material, a carbon nanotube material, a carbon resistivity switching material, a graphene switchable resistance material, a phase change material, a conductive bridge element, an electrolyte switching material, or a switchable polymer material.

3. The method of claim 1, wherein:
    the storage element and the diode steering element comprise a pillar shaped cell located over a lower electrode and under an upper electrode; and
    the diode steering element is located over or under the storage element.

4. A method of making a nonvolatile memory cell, comprising:
    forming a diode steering element;
    passivating at least one interface of the diode steering element; and
    forming a storage element before or after forming the diode steering element;
    wherein the at least one interface of the diode comprises a p-n junction of a p-n semiconductor diode, or an interface between a p-type or n-type semiconductor region of a p-i-n semiconductor diode and an i-type semiconductor region of the p-i-n semiconductor diode;
    wherein said passivating the at least one interface of the diode steering element comprises:
        forming an insulating layer containing passivating atoms on the diode steering element;
        melting a portion of the diode steering element adjacent to the insulating layer such that at least a portion of the passivating atoms diffuse from the insulating layer to the at least one interface of the diode steering element; and
        removing the insulating layer.

5. The method of claim 4, wherein:
    the insulating layer comprises a $SiO_xF_y$ layer where $0<x, y<1$;
    the diode steering element comprises amorphous silicon or polysilicon;
    the melting comprises laser melting the $SiO_xF_y$ layer and the adjacent p-type or n-type semiconductor region of the diode steering element up to the at least one interface of the diode steering element; and
    the amorphous silicon or polysilicon melts and recrystallizes as polysilicon.

6. A method of making a nonvolatile memory cell, comprising:
    forming a diode steering element;
    passivating at least one interface of the diode steering element; and
    forming a storage element before or after forming the diode steering element;
    wherein the at least one interface of the diode comprises a p-n junction of a p-n semiconductor diode, or an interface between a p-type or n-type semiconductor region of a p-i-n semiconductor diode and an i-type semiconductor region of the p-i-n semiconductor diode;

wherein said passivating the at least one interface of the diode steering element comprises exposing at least a portion of the diode steering element to a hydrogen or fluorine containing atmosphere at an elevated temperature.

7. The method of claim 6, wherein:

the passivating the at least one interface of the diode steering element comprises exposing at least a portion of the diode steering element to the hydrogen containing atmosphere selected from ammonia, hydrogen plasma, or forming gas to diffuse hydrogen into the diode steering element; and the elevated temperature comprises about 450 degrees Celsius to about 550 degrees Celsius.

8. A method of making a nonvolatile memory cell, comprising:

forming a diode steering element;

passivating at least one interface of the diode steering element; and forming a storage element before or after forming the diode steering element;

wherein the at least one interface of the diode comprises a p-n junction of a p-n semiconductor diode, or an interface between a p-type or n-type semiconductor region of a p-i-n semiconductor diode and an i-type semiconductor region of the p-i-n semiconductor diode;

wherein said passivating the at least one interface of the diode steering element comprises implanting at least a portion of the diode steering element with passivating ions.

9. The method of claim 8, wherein:

the at least one interface of the diode steering element comprises a junction between a p-type or n-type semiconductor region of the diode steering element and an i-type semiconductor region of the diode steering element; and said implanting the at least a portion of the diode steering element with passivating ions comprises:

forming a pad oxide on the diode steering element;

implanting hydrogen ions up to and including the at least one interface of the diode steering element; and removing the pad oxide.

10. The method of claim 9, wherein a peak of the hydrogen doping profile is located at about the at least one interface of the diode steering element.

11. A method of making a nonvolatile memory cell, comprising:

forming a diode steering element;

passivating at least one interface of the diode steering element; and forming a storage element before or after forming the diode steering element;

wherein the at least one interface of the diode steering element has a trap density of less than $1 \times 10^{12}$ traps per $cm^2$ after the step of passivating.

12. A method of making a nonvolatile memory cell, comprising:

forming a diode steering element;

passivating at least a portion of the diode steering element; and forming a storage element before or after forming the diode steering element, wherein:

the storage element and the diode steering element comprise a pillar shaped cell located over a lower electrode and under an upper electrode;

the diode steering element is located over or under the storage element;

the diode steering element comprises a pillar shaped p-i-n silicon diode including a top p or n-type silicon region, a middle intrinsic silicon region, and a bottom n or p-type silicon region; and wherein said passivating at least a portion of the diode steering element comprises passivating at least the top silicon region with hydrogen or fluorine.

13. The method of claim 12, wherein said passivating at least a portion of the diode steering element comprises passivating the top and middle silicon regions with hydrogen or fluorine, without passivating the bottom silicon region.

14. The method of claim 12, wherein said passivating at least a portion of the diode steering element comprises passivating at least one of grain boundaries of polysilicon diode material, and an interface between the polysilicon diode material and a silicon oxide pad layer located over the diode.

15. The method of claim 12, wherein said passivating at least a portion of the diode steering element comprises:

forming an insulating layer containing fluorine or hydrogen atoms on the diode steering element;

melting a portion of the diode steering element adjacent to the insulating layer such that at least a portion of the fluorine or hydrogen atoms diffuse from the insulating layer into the diode steering element; and removing the insulating layer.

16. The method of claim 12, wherein said passivating at least a portion of the diode steering element comprises exposing at least a portion of the diode steering element to a hydrogen or fluorine containing atmosphere at an elevated temperature.

17. The method of claim 12, wherein said passivating at least a portion of the diode steering element comprises implanting at least a portion of the diode steering element with passivating hydrogen or fluorine ions.

* * * * *